United States Patent [19]

Lee et al.

[11] Patent Number: 5,654,240
[45] Date of Patent: Aug. 5, 1997

[54] INTEGRATED CIRCUIT FABRICATION HAVING CONTACT OPENING

[75] Inventors: Kuo-Hua Lee, Westcosville; Chen-Hua Douglas Yu, Allentown, both of Pa.

[73] Assignee: Lucent Technologies Inc., Murray Hill, N.J.

[21] Appl. No.: 635,226

[22] Filed: Apr. 12, 1996

Related U.S. Application Data

[63] Continuation of Ser. No. 987,213, Jan. 26, 1993, abandoned.

[51] Int. Cl.$^6$ ............................ H01L 21/44; H01L 21/48
[52] U.S. Cl. ..................... 438/647; 438/586; 438/669
[58] Field of Search ................................ 437/193, 195, 437/200, 228; 148/DIG. 19, DIG. 20

[56] References Cited

U.S. PATENT DOCUMENTS

| | | | |
|---|---|---|---|
| 4,288,256 | 9/1981 | Ning et al. | 148/1.5 |
| 4,373,251 | 2/1983 | Wilting . | |
| 4,978,637 | 12/1990 | Liou et al. | 437/193 |
| 4,994,402 | 2/1991 | Chiu | 437/41 |
| 5,013,686 | 5/1991 | Choi et al. | 437/194 |
| 5,110,753 | 5/1992 | Gill et al. | 437/52 |
| 5,124,280 | 6/1992 | Wei et al. | 437/193 |
| 5,149,665 | 9/1992 | Lee | 437/43 |
| 5,151,387 | 9/1992 | Brady et al. | 437/191 |
| 5,162,262 | 11/1992 | Ajika et al. | 437/200 |
| 5,210,048 | 5/1993 | Shoji et al. | 437/43 |
| 5,246,883 | 9/1993 | Lin et al. | 437/195 |
| 5,256,248 | 10/1993 | Jun | 156/653 |
| 5,256,584 | 10/1993 | Hartmann | 437/43 |
| 5,270,240 | 12/1993 | Lee | 437/52 |

OTHER PUBLICATIONS

*Introcution to Microelectronic Fabrication*, vol. V, Modular Series on Solid State Devices, G.W. Neudeck et al., Addison–Wesley Publishing Company, pp. 142–145, no date provided.

Wolf et al., "Silicon Processing for the ULSI Era," vol. I, pp. 183–185, 1990, no month provided.

*Primary Examiner*—John Niebling
*Assistant Examiner*—Richard A. Booth
*Attorney, Agent, or Firm*—John T. Rehberg

[57] ABSTRACT

A method of semiconductor fabrication having applicability to forming contacts to sources and drains especially in SRAM applications is disclosed. A dielectric and an overlying polysilicon conductor are formed and patterned thereby exposing a semiconductor substrate. A silicide layer is deposited, thereby contacting the polysilicon layer and the substrate. Subsequent patterning of the silicide layer using an oxide hard mask provides electrical contact between the polysilicon layer and the substrate without the risk of trenching into the substrate.

13 Claims, 7 Drawing Sheets

INTEGRATED CIRCUIT FABRICATION HAVING CONTACT OPENING

This application is a continuation of Ser. No. 07/987,213, filed Jan. 26, 1993, now abandoned.

TECHNICAL FIELD

This invention relates generally to a method of making semiconductor integrated circuits and particularly to a method which forms contacts to sources or drains.

BACKGROUND OF THE INVENTION

In the manufacture of semiconductor integrated circuits utilizing field effect transistors, it is often necessary to form electrical contacts to either the source or drain region. Various techniques and structures have been devised for forming contacts to source or drain regions.

In the design of Static Random Access Memories (SRAMs) it is generally necessary to connect the source/drain of an access transistor to the gate of a pull-down transistor. For example, in FIG. 1, the junctions denoted by reference numerals 11 and 13 provide instances in which, for example, the gate of pull-down transistor 15 is connected to the source/drain of access transistor 19 or, the gate of pull-down transistor 17 is connected to the source/drain of access transistor 21.

In conventional SRAM fabrication, one of the connections (11 or 15) is made at the so-called "poly-1" level. That is, the polysilicon which forms the gate of the respective pull-down transistor is patterned over the source/drain region of the access transistor, thereby forming a direct contact. The other access/pull-down connection is often made at a higher level of the integrated circuit (i.e., perhaps at the "poly-2" level or higher).

FIGS. 2–5 illustrate a problem which occurs when a polysilicon gate is patterned directly over a source/drain. In FIG. 2, reference numeral 23 denotes a substrate which may be, typically, silicon, epitaxial silicon, doped silicon, etc. In general, the term substrate refers to a material or to a layer upon which other materials may be subsequently formed. Reference numeral 25 denotes a junction region which comprises the source or drain of an access transistor, such as transistors 19 or 21 in FIG. 1. Reference numeral 27 denotes a dielectric layer which, typically, may be silicon dioxide or silicon oxynitride. If layer 27 is silicon dioxide, it may typically have a thickness of approximately 100 Å. In FIG. 3, layer 27 has been patterned exposing surface 29 of junction 25. In FIG. 4, polysilicon layer 31 has been deposited to cover exposed surface 29 of junction 25. It is desired that polysilicon layer 31 should be patterned using a photoresist. Photoresist 33 is subsequently deposited over polysilicon layer 31 and patterned. It is desirable that edge 35 of photoresist 33 be immediately above (or, in FIG. 4, to the left of) edge 37 of patterned dielectric 27.

Should edge 35 of photoresist 33 be slightly misaligned (and, as shown in FIG. 4, somewhat to the right of edge 37 of dielectric 27, i.e., should edge 35 overlie the opening defined by edge 37 of dielectric 27), subsequent exposure of polysilicon layer 31 to an etchant species may cause trenching into junction 25 of substrate 23. The trenching may damage the electrical characteristics of the junction and, under worst circumstances, may completely penetrate junction 25. Thus, an examination of FIGS. 4 and 5 shows that, if patterned edge 35 of resist 33 is positioned parallel with, or to the left of, patterned edge 37 of dielectric 27 (i.e., edge 35 overlies layer 27), subsequent etching will stop on dielectric 27 and not damage junction 25. However, should patterned edge 35 or photoresist 33 be to the right of patterned edge 37 of dielectric 27, the trench 39 depicted in FIG. 5 may be obtained.

SUMMARY OF THE INVENTION

Accordingly, the trenching problem is addressed by this invention which illustratively includes:

forming a patterned dielectric over a substrate, the patterned dielectric exposing a portion of the substrate;

forming a patterned first conductor over the patterned dielectric, the first conductor not contacting the substrate;

forming a second conductor layer over the first patterned conductor;

forming a material layer over the second conductor;

patterning the material layer, thereby creating an edge of the material layer and exposing a portion of the second conductor; and etching the exposed portion of the second conductor.

Illustratively, the first conductor is a poly 1 conductor which is patterned so it does not contact the substrate. The second conductor is a silicide which serves to connect the poly 1 and the substrate.

DETAILED DESCRIPTION

DETAILED DESCRIPTION

Figure 1:
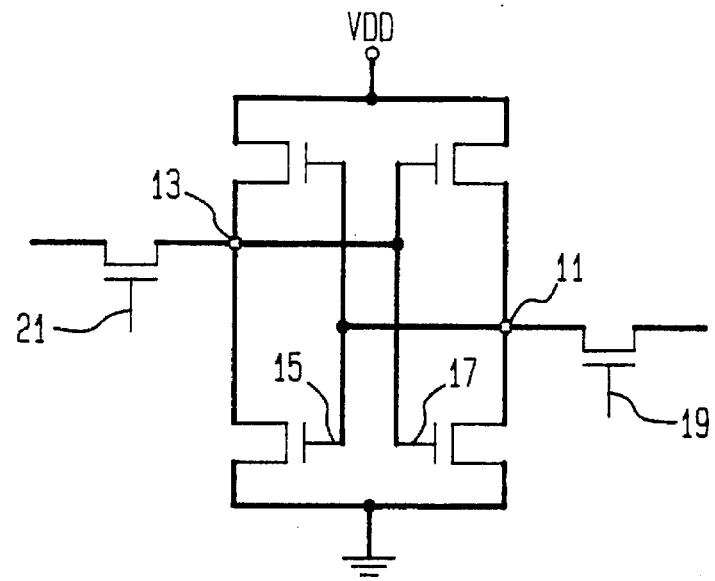
FIG. 1 is a circuit diagram illustrating a typical SRAM.
Figure 2:
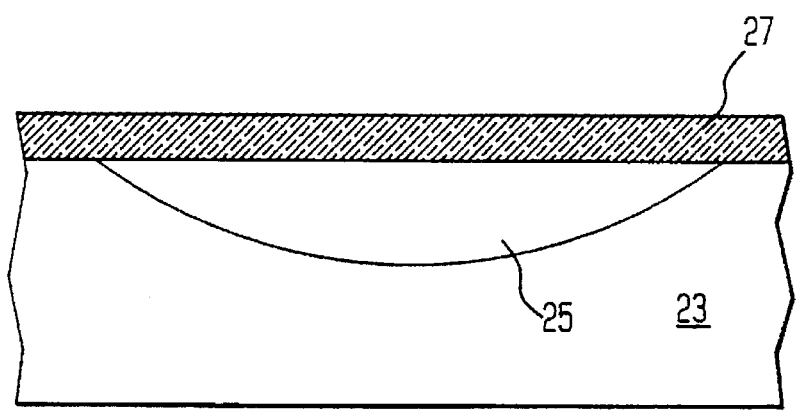
FIGS. 2–5 are cross-sectional views which illustrate a problem inherent in semiconductor fabrication processes.
Figure 3:
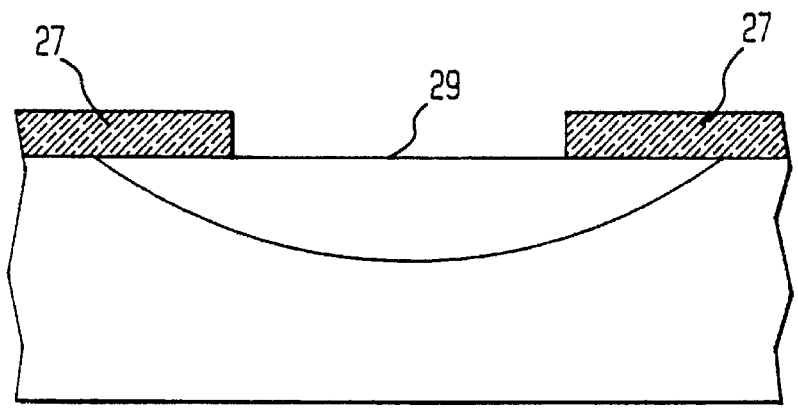
Figure 4:
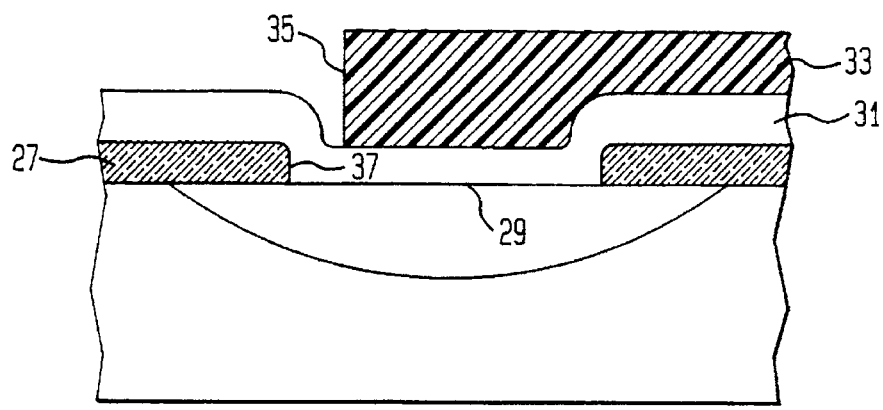
Figure 5:
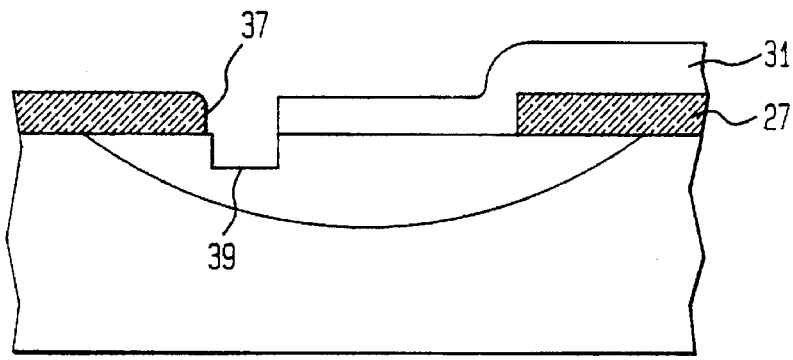
Figure 6:
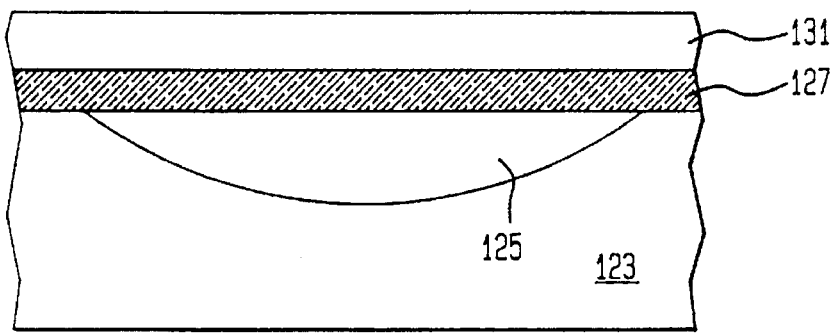
FIGS. 6–18 are cross-sectional views useful in understanding an illustrative embodiment of the present invention.

In FIG. 6, reference numeral 123 designates a substrate which may typically be silicon, epitaxial silicon, or doped silicon. Doped region 125 may be formed, for example, by diffusion or ion implantation. Alternatively, doped region 125 may be formed at a later stage in the process by driving dopants out from subsequently formed silicide layers. For convenience in visualization, doped region 125 is depicted at the early stage of the inventive process. Layer 127 is a dielectric layer, typically silicon dioxide, having a thickness of approximately 100 Å or, possibly, silicon oxynitride. Layer 131 is desirably a conductor such as polysilicon, typically having a thickness of approximately 1000 Å. Illustratively, layers 127 and 131 are formed during the early stages of semiconductor integrated circuit processing. Both layers 127 and 131 may, in other parts of the integrated circuit, comprise respectively a gate oxide and gate conductor.

Figure 7:
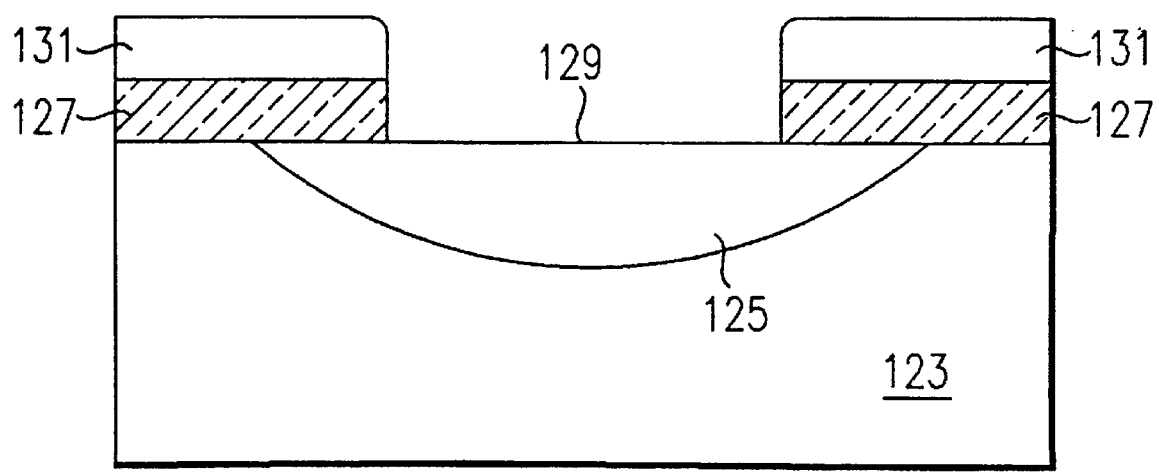

Turning to FIG. 7, layers 127 and 131 have been patterned, exposing surface 129 of substrate 123. It is desired to make a patterned electrical connection between layer 131 and surface 129.

Figure 8:
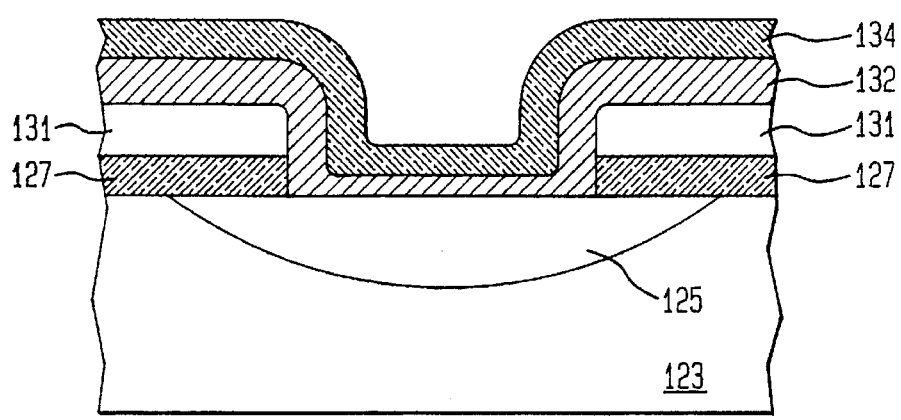

In FIG. 8, blanket layers of a refractory metal silicide, for example, tungsten silicide 132, and a dielectric 134, for example, plasma-enhanced TEOS or BPTEOS may be deposited. If desired, before (or even after) formation of layer 134, silicide 132 may be doped, perhaps by ion implantation. An anneal may be performed to drive the dopants from silicide 132 into substrate 123, thereby forming junction region 125 (which has been depicted since FIG. 6 for conceptual convenience).

It is desired to pattern layers 132 and 134 so that the patterned edges of these layers are co-linear with (or to the left of) the edges of dielectrics 131 and 127. That is, turning to FIG. 9, after photoresist 135 is deposited and spun, photoresist 135 is patterned creating edge 136. Ideally, edge 136 is co-linear with edge 137 of layers 131 and 127, respectively. Should edge 136 be co-linear with edge 137, turning to FIG. 10, layer 134 may be etched to create a hard mask and, subsequently, layer 132 may be etched with the aid of the hard mask to create patterned conductor 138 with patterned edge 139 which precisely abuts edge 137 of layers 131 and 127.

Figure 9:
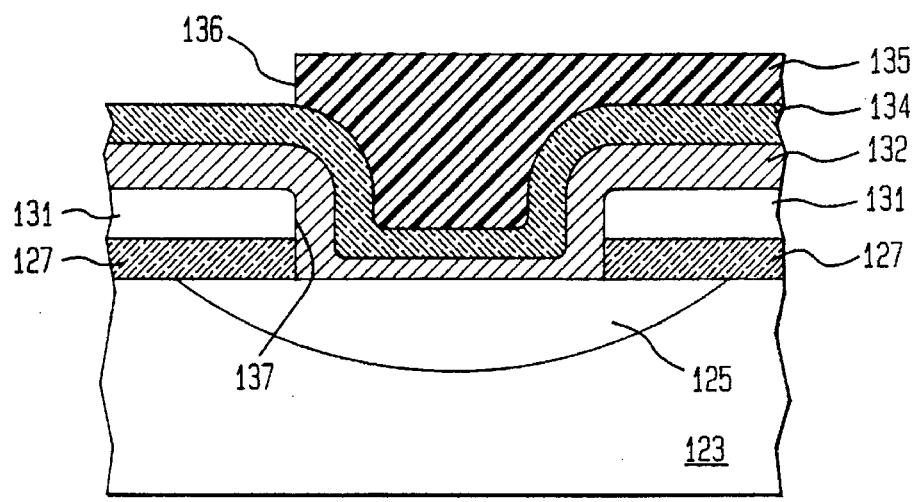
Figure 10:
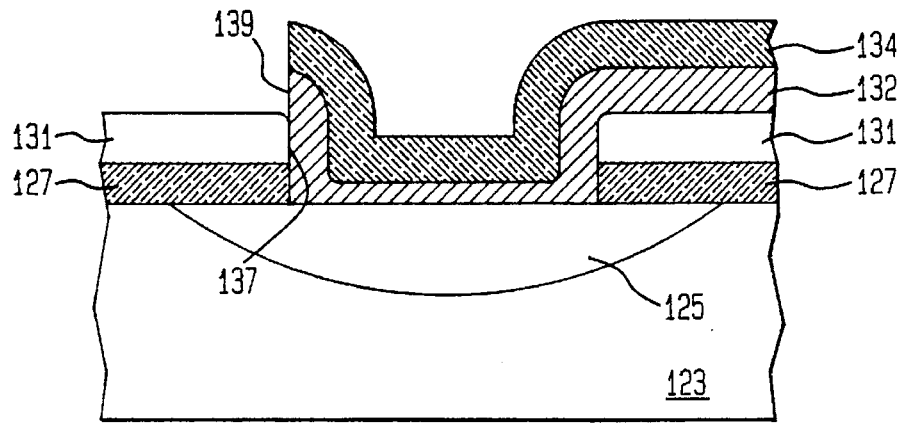

Returning to FIG. 9, unfortunately, it is not always possible, because of alignment tolerances, to pattern photoresist 135 so that edge 136 is precisely co-linear with edge 137 of layers 131 and 127. Sometimes, edge 136 will be to the left of edge 137; on other occasions, edge 136 may be positioned to the right of edge 137. In FIG. 9, edge 136 may be described as overlying edge 137, which defines an opening over substrate 123.

Figure 11:
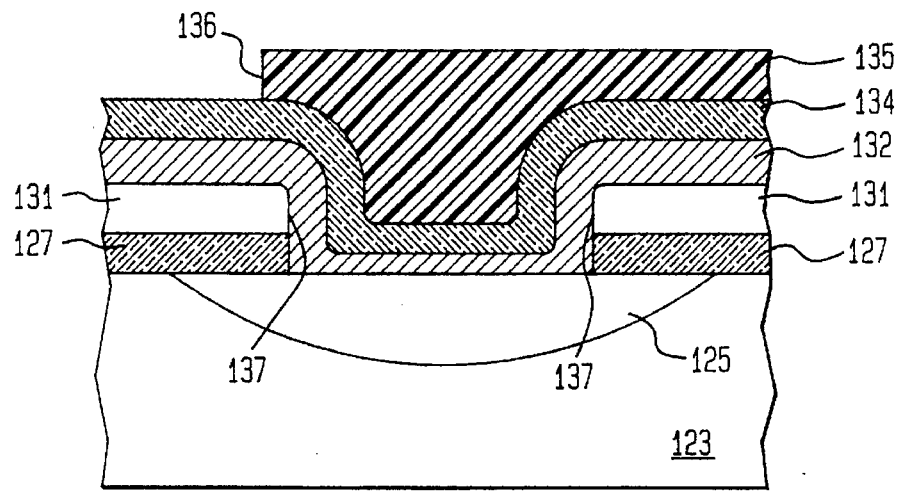
Figure 12:
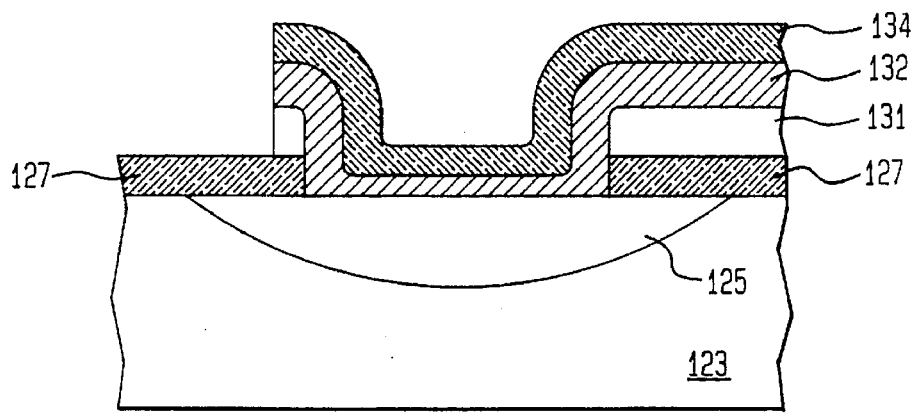

FIGS. 11 and 12 illustrate what happens when edge 136 of photoresist 135 is positioned, because of misalignment tolerances, to the left of edge 137. In other words, patterned edge 136 of photoresist 135 does not overlie the opening created by edge 137 over substrate 123.

Examining FIGS. 11 and 12, after the patterning of resist 135, an anisotropic etch is performed, thereby forming the configuration depicted in FIG. 12. It will be noted that polysilicon layer 131 is etched together with silicide layer 132 and dielectric 134. Subsequent processing may be employed to remove dielectric 134, if desired. An alternative method of etching (proceeding from FIG. 11) is to etch a hard mask into dielectric 134 and then, employing the hard-mask technique, etch underlying layers 132 and 131.

It will be noted that, in the situations depicted in FIGS. 9–10 and 11–12 (i.e., those situations in which the edge of the photoresist mask is outside or coincident with the edge of the opening defined by layers 127 and 131), that no problem will occur, even if more conventional processing techniques described in FIGS. 2–5 are employed. However, should the defining edge 136 of photoresist 134 overlie the openings defined by edge 137 of layers 127 and 131, use of the technique described in FIGS. 2–5 cannot eliminate a risk of trenching. However, applicants' inventive procedure helps to avoid trenching, provided the misalignment is not too great.

Figure 13:
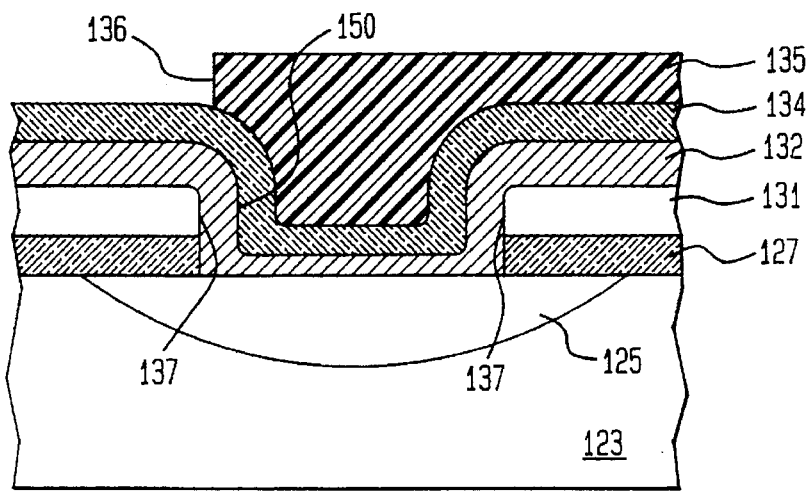

In FIG. 13, it will be noted that edge 136 of photoresist 135 is slightly interior to edges 137. That is, edge 136 overlies the opening over substrate 123 defined by edge 137. In FIG. 13, edge 136 overlies the vertical sidewall 150 of silicide layer 132.

Figure 14:
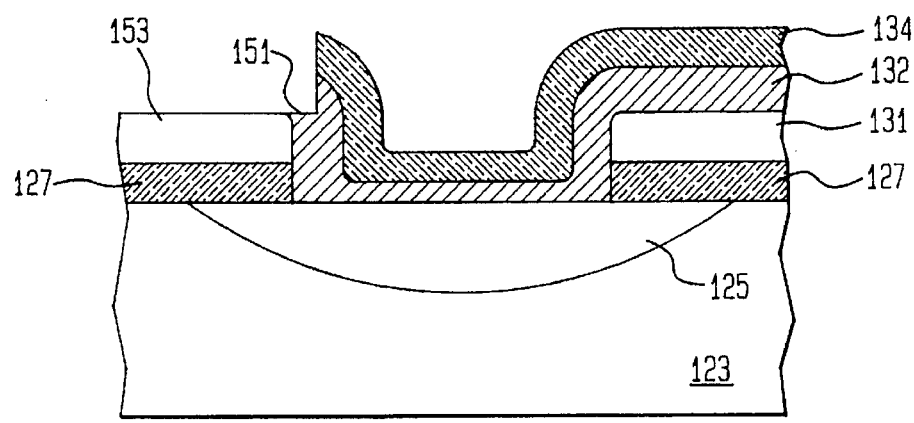

After etching of layers 134 and 132 is completed, the configuration depicted in FIG. 14 is obtained. It will be noted, examination of FIG. 14 shows that the sidewall portion 150 of silicide layer 134 has protected substrate 123 against trenching (unlike the case depicted in FIG. 5). Etching of layers 134 and 132 produces a flat surface 151 in silicide 134 which is roughly parallel with upper surface 153 of polysilicon layer 131.

Figure 15:
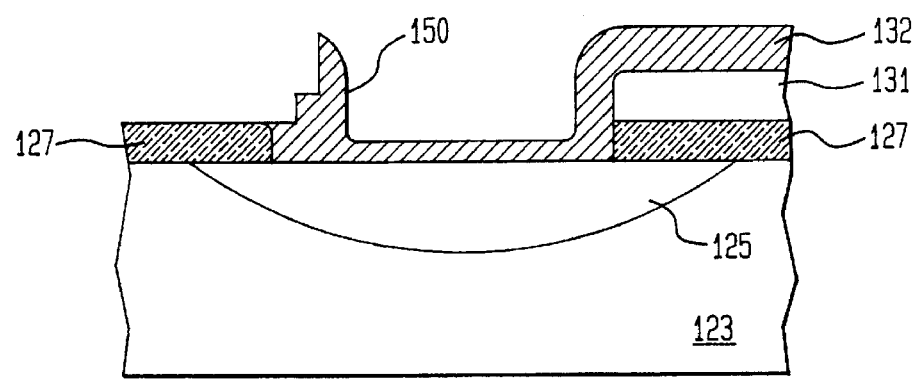

In FIG. 15, further etching has been performed to remove that portion of polysilicon layer 131 at the left-most part of the figure and to remove dielectric 134. Again, examination of FIG. 15 shows that the presence of sidewall 150 has prevented trenching of the substrate.

Figure 16:
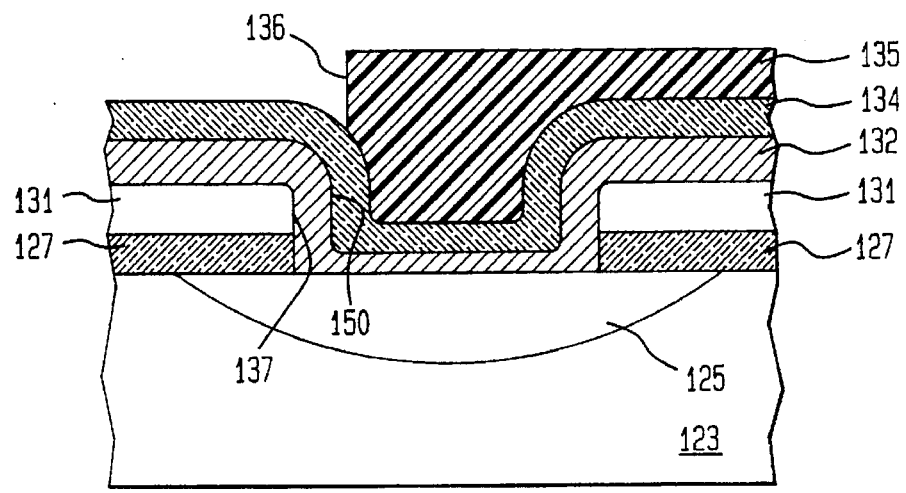
Figure 17:
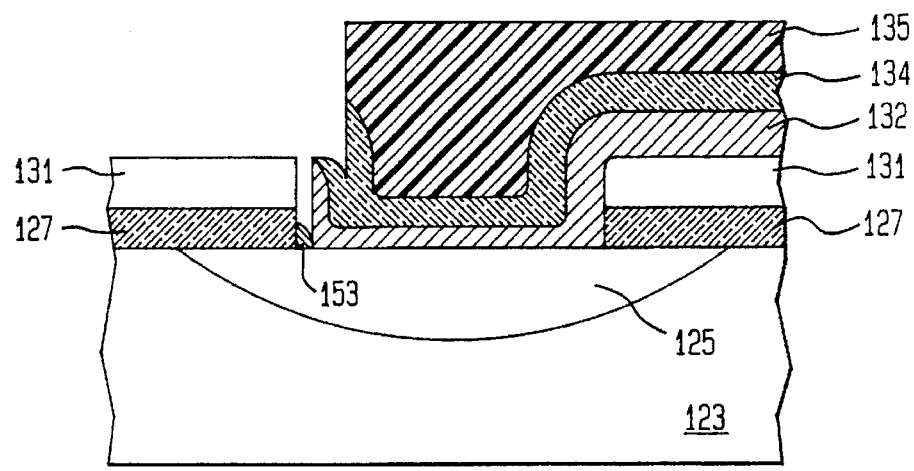
Figure 18:
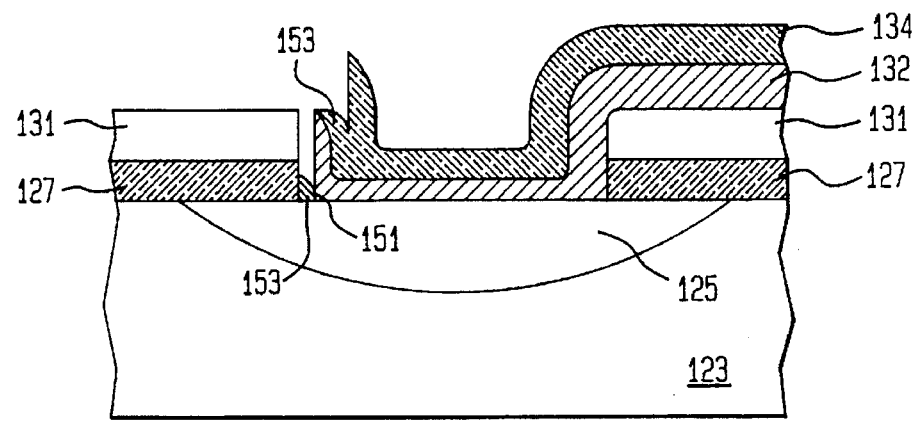

Slightly greater misalignments than that depicted in FIGS. 13–15 may also be tolerated. FIGS. 16, 17, and 18 depict an example of somewhat greater misalignment.

In FIG. 16, edge 136 of resist 135 is positioned interior to edge 137. Furthermore, edge 136 of resist 135 is interior to edge 150 of silicide layer 132. In FIG. 17, layers 134 and 132 are etched (with or without hard-mask techniques). Finally, in FIG. 18, the exposed portion of polysilicon layer 131 has been removed, leaving oxide layer 127. It will be noted that silicide layer 132 is etched during the removal of polysilicon layer 131. Should (returning to FIG. 16) edge 136 of photoresist 135 be positioned too far to the right, i.e., too far to the interior of the opening defined by edge 137, there is some danger that in the structure ultimately formed and depicted in FIG. 18, that cusp 151 adjacent fillet 153 may touch, or in worst circumstances, penetrate the substrate.

We claim:

1. A method of semiconductor integrated circuit fabrication comprising:

forming a patterned dielectric over a substrate, said patterned dielectric exposing a portion of said substrate;

forming a patterned first conductor over said patterned dielectric, said patterned first conductor not contacting said substrate; said patterned first conductor having a top and a side;

forming a second conductor layer contacting the said top and side of said first conductor; and contacting said substrate;

forming a material layer over said second conductor;

patterning said material layer, thereby creating an edge of said material layer and exposing a portion of said second conductor layer; and etching the exposed portion of said second conductor layer, thereby removing at least a portion of said second conductor which was over said patterned first conductor.

2. The method of claim 1 in which said first conductor is polysilicon.

3. The method of claim 1 in which said second conductor is a refractory metal silicide.

4. The method of claim 3 in which said refractory metal silicide is tungsten silicide.

5. The method of claim 1 in which said material layer is silicon dioxide.

6. The method of claim 5 in which said silicon dioxide is formed from TEOS.

7. The method of claim 1 in which said step of patterning said material layer creates an edge which overlies the previously exposed portion of said substrate.

8. The method of claim 7 in which said second conductor has a first portion which has a first thickness measured perpendicular from the substrate surface which covers a substantial portion of the previously exposed portion of said substrate and said second conductor has a second portion which has a second thickness measured perpendicular from said substrate surface said second thickness being greater than said first thickness, said second portion being adjacent said patterned dielectric and said patterned first conductor, and in which said edge of said material layer overlies said second portion of said second conductor having said second thickness.

9. The method of claim 1 in which said step of patterning said material layer creates said edge which is not vertically above the previously exposed portion of the substrate.

10. The method of claim 8 further including the steps of removing said material layer.

11. The method of claim 10 in which a portion of said first patterned conductor layer is exposed during the said etching of the exposed portion of the said second conductor layer and said portion of said first patterned conductor layer is subsequently removed.

12. The method of claim 7 in which said second conductor has a first portion which has a first thickness measured perpendicular from the substrate surface said first thickness covering a substantial portion of the previously exposed portion of said substrate and said second conductor has a second portion which has a second thickness measured perpendicular from said substrate surface said second thickness being greater than said first thickness, said second portion being adjacent said patterned dielectric and said patterned first conductor, and in which said edge of said material layer overlies said first portion of said second conductor having said first thickness.

13. The method of claim 12 further including the step of removing said material layer.

\* \* \* \* \*